United States Patent [19]
Ohtani

[11] Patent Number: 6,083,801
[45] Date of Patent: Jul. 4, 2000

[54] MANUFACTURING METHOD OF SEMICONDUCTOR AND MANUFACTURING METHOD OF SEMICONDUCTOR DEVICE

[75] Inventor: Hisashi Ohtani, Kanagawa, Japan

[73] Assignee: Semiconductor Energy Laboratory Co., Ltd., Kanagawa-ken, Japan

[21] Appl. No.: 09/021,639

[22] Filed: Feb. 10, 1998

[30] Foreign Application Priority Data

Feb. 10, 1997 [JP] Japan ................................. 9-041540

[51] Int. Cl.[7] .......................... H01L 21/00; H01L 21/84; H01L 21/324; H01L 21/477; H01L 21/26
[52] U.S. Cl. .................... 438/308; 438/795; 438/796; 438/797; 438/798; 438/799; 438/96; 438/166; 438/308
[58] Field of Search ..................... 438/308, 795, 438/796, 797, 798, 799, 96, 166

[56] References Cited

U.S. PATENT DOCUMENTS

| | | | |
|---|---|---|---|
| 4,001,047 | 1/1977 | Boah | 438/799 |
| 5,612,250 | 3/1997 | Ohtani et al. | 437/101 |
| 5,616,506 | 4/1997 | Takemura | 438/150 |
| 5,637,515 | 6/1997 | Takemura | 438/162 |
| 5,643,826 | 7/1997 | Ohtani et al. | 437/88 |
| 5,840,118 | 11/1998 | Yamazaki | 117/103 |
| 5,932,893 | 8/1999 | Miyanaga et al. | 257/66 |
| 5,937,282 | 8/1999 | Nakajima et al. | 438/149 |
| 5,956,579 | 9/1999 | Yamazaki et al. | 438/151 |
| 5,966,594 | 10/1999 | Adachi et al. | 438/151 |
| 5,994,172 | 11/1999 | Ohtani et al. | 438/151 |

*Primary Examiner*—Carl Whitehead, Jr.
*Assistant Examiner*—James Park
*Attorney, Agent, or Firm*—Fish & Richardson P.C.

[57] ABSTRACT

The nickel element is provided selectively, i.e., adjacent to part of the surface of an amorphous silicon film in a long and narrow opening. The amorphous silicon film is irradiated with linear infrared light beams emitted from respective linear infrared lamps while scanned with the linear beams perpendicularly to the longitudinal direction of the opening. The longitudinal direction of the linear beams are set coincident with that of the opening. The infrared light beams are absorbed by the silicon film mainly as thermal energy, whereby a negative temperature gradient is formed in the silicon film. The temperature gradient moves as the lamps are moved for the scanning. The direction of the negative temperature gradient is set coincident with the lamp movement direction and an intended crystal growth direction, which enables crystal growth to proceed parallel with a substrate uniformly over a long distance.

82 Claims, 6 Drawing Sheets

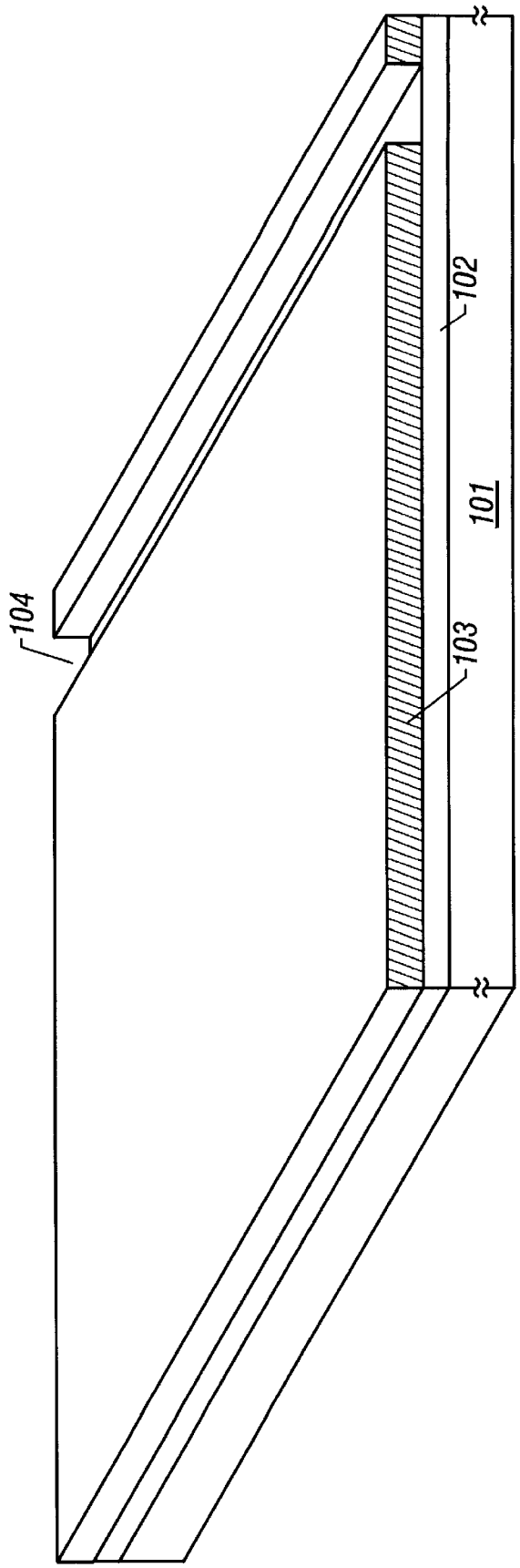

MANUFACTURING METHOD OF SEMICONDUCTOR AND MANUFACTURING METHOD OF SEMICONDUCTOR DEVICE

BACKGROUND OF THE INVENTION

1. Field of the Invention

The present invention relates to a method of forming a semiconductor film comprising silicon or silicon compound having crystallinity over an insulating surface.

2. Description of the Related Art

A conventional technique is known in which a silicon film is formed over a glass or quartz substrate and a thin-film transistor (hereinafter referred to as "TFT") is formed by using the thus-formed silicon film.

The TFT is mainly used in the active matrix liquid crystal display device. The TFT is generally classified into the TFT using an amorphous silicon film and the TFT using a crystalline silicon film.

At present, the TFT using an amorphous silicon film is the mainstream. However, the TFT using an amorphous silicon film is low in operation speed and hence its applicability is limited for purposes of reducing the size of a displayed image and displaying a high-speed moving picture.

Further, it is also attempted to constitute, by using TFTs, various circuits that are conventionally implemented as ICs. In this case, the operation speed of the TFT using an amorphous silicon film is much lower than a required value.

In view of the above, the TFT using a crystalline silicon film which is expected to operate at higher speed is now being studied extensively.

Among well known methods for obtaining a crystalline silicon film are:

(1) forming a crystalline silicon film directly by CVD or the like;

(2) crystallizing an amorphous silicon film by a heat treatment;

(3) crystallizing an amorphous silicon film by irradiating it with laser light; and (4) crystallizing an amorphous silicon film by irradiating it with strong light such as infrared light.

Among the above methods, methods (2)–(4) are mainly used.

Although method (2) is advantageous in that it can easily provide a large-area film, the heat treatment temperature should be high and the quality of a resulting film is insufficient.

Although method (3) is advantageous in that thermal damage does not reach a glass substrate and a film having superior crystallinity can be obtained, it is difficult for method (3) to provide a large-area film and the reproducibility of a process is low.

Although method (4) can easily provide a large-area film, the quality of a resulting film is insufficient.

Studies of the present inventors revealed that the crystallization of an amorphous film can be accelerated by using a metal element typified by nickel (refer to Japanese Unexamined Patent Publication Nos. Hei. 6-232059 and Hei. 7-321339).

By combining the crystallization technique using a metal element with methods (2)–(4), a crystalline silicon film can be obtained that has such high film quality as could not be obtained so far.

However, the crystallinity thus obtained is still insufficient as compared to that of a single crystal silicon wafer and the characteristics of a resulting TFT are far lower than those of a currently available insulated-gate field-effect transistor that constitutes an IC. In particular, there is a serious problem that variations in device characteristics are large.

This is because grain boundaries exist in an uncontrollable state in a crystalline silicon film, i.e., in the channel of a TFT. In particular, since the grain boundaries extending direction cannot be controlled, the device characteristics vary to a large extent due to differences in extending directions of grain boundaries existing in the channels, which necessarily occur when a large number of devices are formed.

SUMMARY OF THE INVENTION

An object of the present invention is to provide a technique for obtaining a crystalline silicon film that can provide superior TFT characteristics on a substrate having an insulating surface.

According to one aspect of the invention, there is provided a method for crystallizing at least part of an amorphous film made of silicon or a silicon compound by using a metal element for accelerating crystallization, comprising the steps of introducing the metal element into part of the amorphous film; and forming a temperature gradient in the amorphous film and causing crystal growth from a region where the metal element is introduced to another region by utilizing the temperature gradient.

According to another aspect of the invention, there is provided a method for crystallizing at least part of an amorphous film made of silicon or a silicon compound by using a metal element for accelerating crystallization, comprising the steps of introducing the metal element into part of the amorphous film; and forming a temperature gradient in the amorphous film in a direction extending from a region where the metal element is introduced to another region and causing crystal growth in the temperature gradient direction.

According to a further aspect of the invention, there is provided a method for crystallizing at least part of an amorphous film made of silicon or a silicon compound by using a metal element for accelerating crystallization, comprising the steps of introducing the metal element into part of the amorphous film; and causing the metal element to diffuse in a predetermined direction by utilizing the temperature gradient and causing crystal growth to proceed selectively in the predetermined direction.

In each of the three aspects of the invention, it is preferable to move the temperature gradient in the direction of the crystal growth, to thereby facilitate crystal growth in a direction parallel with the amorphous film.

Crystal growth in a direction parallel with the amorphous film can be facilitated by moving the temperature gradient in the direction of the crystal growth at a speed corresponding to the rate of the crystal growth. This is particularly effective in obtaining a long crystal growth direction.

It is simple and convenient to form the temperature gradient by irradiation with linear infrared light. A means for instantaneously melting and solidifying a surface portion of a silicon film, such as a means using ultraviolet pulse laser light, cannot be used because actually it does not form a temperature gradient.

From the viewpoint of reproducibility and effects, it is preferable to use nickel as the metal element for accelerating the crystallization.

The metal element may be one or a plurality of elements selected from Fe, Co, Ni, Cu, Ru, Rh, Pd, Os, Ir, Pt, and Au.

BRIEF DESCRIPTION OF THE DRAWINGS

FIG. 3 is a perspective view corresponding to FIG. 1A;

DETAILED DESCRIPTION OF THE PREFERRED EMBODIMENTS

To practice the invention, it is important to form a negative temperature gradient in the direction of crystal growth that is performed by utilizing a metal element.

A specific example for realizing the above concept will be described below with reference to FIGS. 1A–1B (sectional views) and FIG. 4 (perspective view).

Figure 1A:
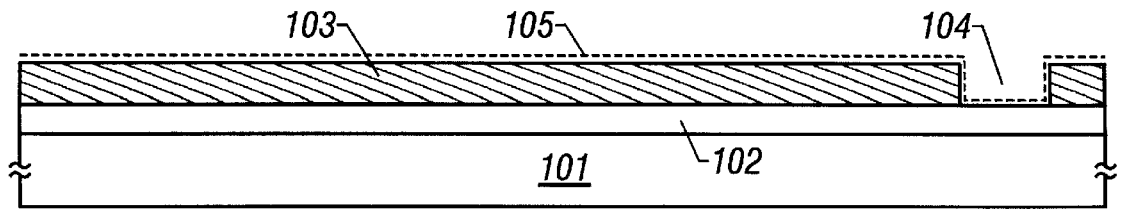
FIGS. 1A–1C show a step of obtaining a crystalline silicon film according to a first embodiment of the present invention.

First, as shown in FIG. 1A, the nickel element is provided selectively adjacent to the surface of an amorphous silicon film 102, i.e., adjacent to a part of the surface of the amorphous silicon film (the region of an opening 104). The region where the nickel element is introduced has a linear shape that is long in the direction perpendicular to the paper surface.

Then, linear infrared light emitted from each of linear infrared lamps 107 is reflected by each of reflecting plates 106, whereby the amorphous silicon film 102 is irradiated with linear infrared light beams while being scanned in a direction 100. The longitudinal direction of the linear beams is set coincident with that of the opening 104 (i.e., the extending direction of the nickel introduction region).

Figure 1B:
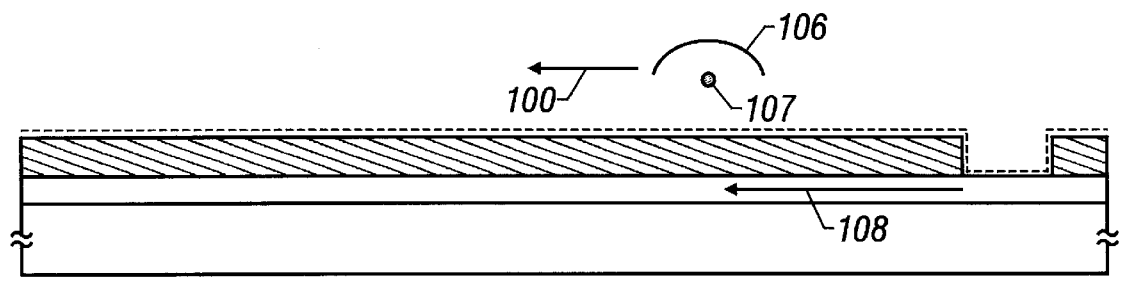
Figure 1C:
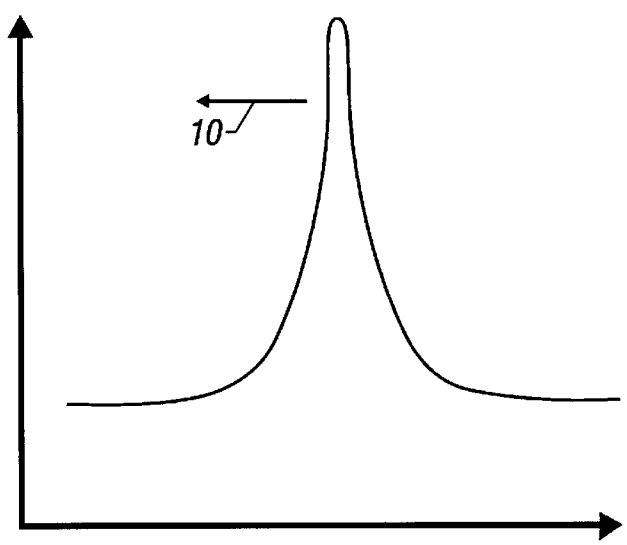

The infrared light is absorbed by the silicon film 102 mainly as thermal energy, whereby a temperature gradient shown in FIG. 1C is formed. The temperature gradient formed in the silicon film 102 moves as the lamp 107 is moved in the direction 100.

The direction (indicated by numeral 10 in FIGS. 1B and 1C) of the negative temperature gradient is set coincident with the lamp movement direction 100 and the direction (indicated by numeral 108 in FIG. 1B) of the intended crystal growth.

In the above manner, the crystal growth can be performed in the direction 108 parallel with a substrate 101 uniformly over a long distance.

Crystal growth proceeds in the direction 108 parallel with the substrate 101 by merely performing a heat treatment in a heating furnace without conducting lamp irradiation.

In the invention disclosed in the specification, it is important to set the direction of the temperature gradient caused by the lamp irradiation and the lamp movement direction coincident with the direction of crystal growth that proceeds by the heat treatment.

This is meaningful in the following points.

In the crystallization technique utilizing a metal element, crystallization proceeds as the metal element diffuses from a particular region (in the case of FIGS. 1A and 1B, the opening 104 is formed) to other regions in the silicon film.

As in the case of impurities diffusion in a semiconductor, the metal element diffuses, with priority, from a region that is high in energy state to a region that is low in energy state.

Since the crystallization using the metal element proceeds in association with the diffusion of the metal element, forcing the diffusion of the metal element leads to control of the crystal growth.

That is, by forming a negative temperature gradient in a direction which coincides with the direction of intended crystal growth, the metal element can be diffused intentionally in such a direction. Intentionally making the diffusion direction of the metal element coincide with a certain direction means intentional acceleration of crystal growth in such a direction.

In this manner, crystal growth can be accelerated in a particular direction.

It is also important to set the temperature gradient movement speed (specifically the lamp movement speed) in accordance with the crystal growth rate. This is to cause uniform crystal growth over a long distance gradually (the movement is performed in a step-like manner depending on the crystal growth states) so as to keep the states of the crystal growth (including the temperature gradient state in the silicon film).

Further, where crystal growth is performed by forming a temperature gradient as shown in FIGS. 1B and 1C, a phenomenon can be restrained that the crystallization without utilizing the action of the metal element obstructs the crystal growth that is caused by utilizing the metal element so as to proceed parallel with the substrate 101.

The crystal growth parallel with the substrate 101 that is caused by utilizing the action of the metal element is stopped in a region where the ordinary crystallization (in general, crystal growth proceeds in an amorphous silicon film by applying energy to it) proceeds that is not caused by utilizing the action of the metal element. This is a factor of reducing the crystal growth length in the direction 108.

According to the invention, by forming a negative temperature gradient, it is possible to reduce the energy to be applied to a region where crystal growth with a metal element is intended. Accordingly, it is possible to avoid the above inconvenience.

In a region where crystal growth has been performed by the above method, crystal growth directions are well equalized and extending directions of grain boundaries well coincide with those crystal growth directions. Further, intervals between grain boundaries can be made approximately equal to each other.

When a number of TFTs are formed by utilizing the above crystal structure, the form of existence of crystal boundaries in the channel region can be made uniform among the TFTs. As a result, variations in characteristics among the TFTs can be restrained.

Embodiment 1

FIGS. 1A–1C and 2A–2E show a manufacturing method according to this embodiment. First, as shown in FIG. 1A, a 500-Å-thick amorphous silicon film 102 is formed on a quartz substrate 101 by low-pressure thermal CVD.

Then, a 700-Å-thick silicon oxide film (not shown) is formed by plasma CVD and an opening 104 is formed therein to form a mask 103. The opening 104 is formed so as to have a linear shape (slit shape) extending perpendicularly to the paper surface of FIGS. 1A and 1B.

FIG. 3 is a perspective view corresponding to FIG. 1A. To describe the structure in a simplified manner, FIG. 3 is drawn in such a manner that the opening 104 reaches two sidelines of the substrate. However, in practicing the invention, the opening 104 need not always have such a shape.

Next, a nickel acetate salt solution containing the nickel element at 10 ppm (in terms of weight) is applied and an excess of the solution is removed with a spin coater. In this state, the nickel element is held in contact with the surface as indicated by numeral 105 in FIG. 1A.

The state of FIG. 1A is thus obtained.

Then, annealing is performed by using a linear lamp annealing apparatus. The lamp annealing apparatus is so configured as to enable irradiation with linear beams by causing infrared light that is emitted from each of long and narrow, rod-like lamps 107 to be reflected by each of reflecting plates 106 (see FIGS. 1B and 4).

Figure 4:
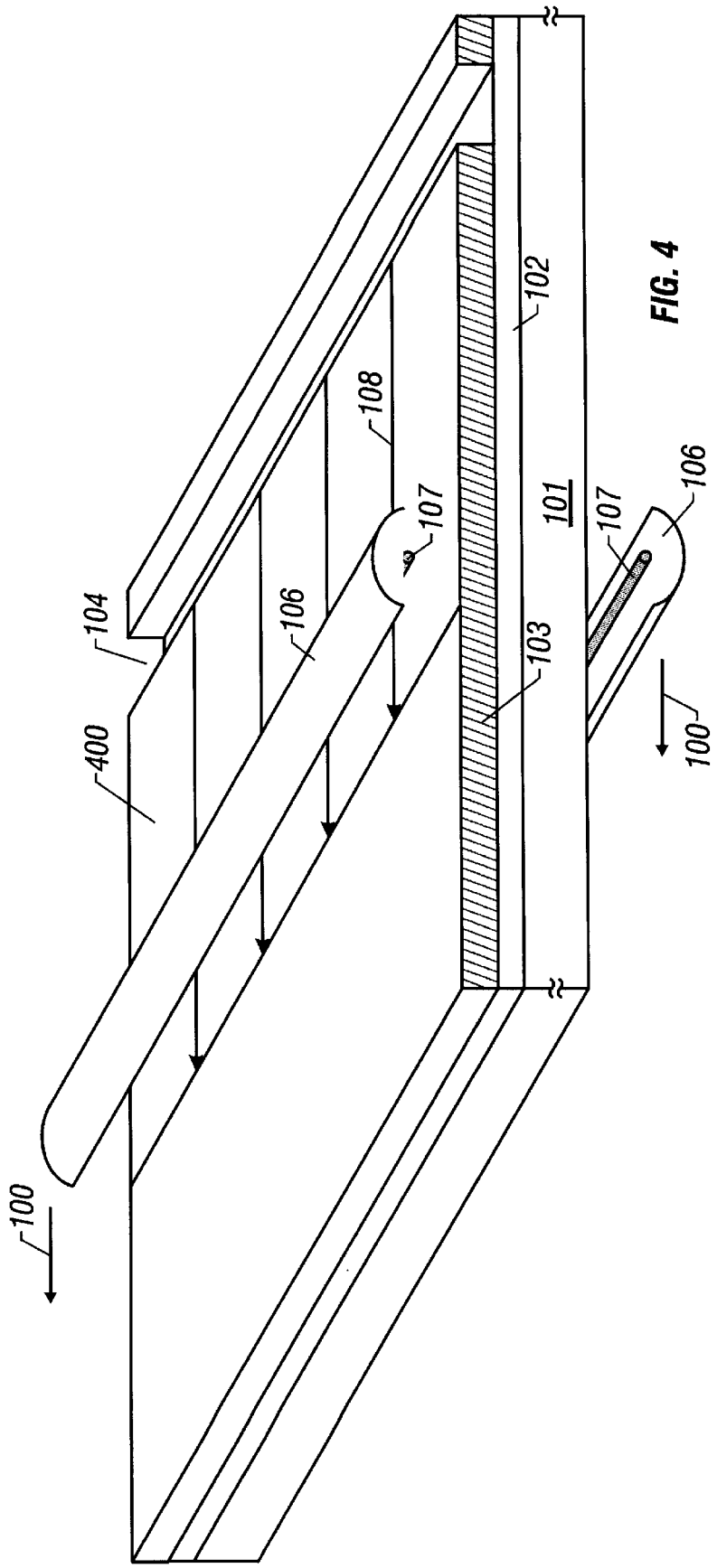
FIG. 4 is a perspective view corresponding to FIG. 1B.

The positional relationship between the sample and the lamps 107 is such as to be shown in FIG. 4. The crystallization is performed as follows:

(1) The longitudinal direction of the beams is set coincident with that of the opening 104.

(2) The linear infrared light beams are moved in the direction (indicated by numeral 100 in FIG. 1B) perpendicular to the linear beams at a given speed starting from the opening 104 or a position close to it.

As a result, a region irradiated with the linear infrared light beams is heated to about 800° C. in a short while. The nickel element is provided adjacent to (held in contact with) the surface of the amorphous silicon film 102 in the region of the opening 104, and it diffuses into the amorphous silicon film 102 as it is irradiated with the infrared light beams. Crystal growth proceeds in a direction 108 due to the action of the diffused nickel element and energy supplied by the infrared light beams.

It is preferred that the scanning speed of the infrared light beams be set equal to the crystal growth rate. The appropriate scanning speed of the infrared light beams needs to be determined by conducting a preliminary experiment because it depends on the thickness and the film quality of the amorphous silicon film 102, the irradiation intensity and the spectrum of the infrared light beams, the heat capacity of the substrate 101, and other factors.

It is also important that a temperature gradient be formed in the silicon film so as to have a temperature profile as shown in FIGS. 1B and 1C. The temperature profile (temperature gradient state) is adjusted by changing the type and/of the positions of the reflecting plates 106 and the positions of the lamps 107.

The crystal growth proceeds perpendicularly to the longitudinal direction of the opening 104 in such a manner that growth directions are generally equal to each other.

FIG. 4 schematically shows a state that a region 400 has been crystallized by the irradiation and the scanning with the linear light beams emitted from the lamps 107. Crystal growth directions are indicated by numeral 108.

Figure 2A:
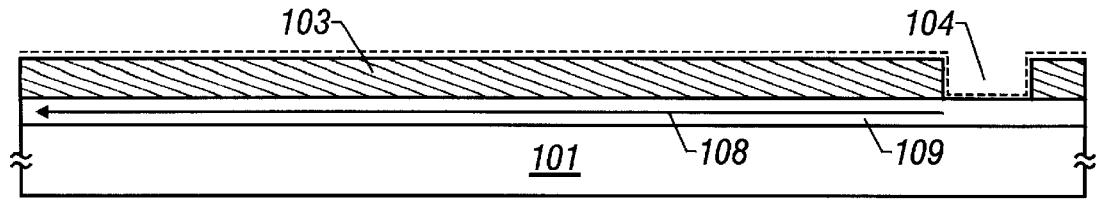
FIGS. 2A–2E shows a manufacturing process of a TFT (thin-film transistor) according to the first embodiment.

In the above manner, a crystalline silicon film 109 is obtained in which the directions of the crystal growth that starts from the region of the opening 104 are well equalized with the direction indicated by numeral 108 in FIG. 2A.

After the crystalline silicon film 109 is obtained, the silicon oxide film mask 103 is removed.

Then, the nickel element is removed from the film 109. Specifically, a 300-Å-thick thermal oxidation film is formed by performing a heat treatment at 950° C. for 30 minutes in an oxygen atmosphere containing HCl at 3 volume percent. The nickel element is removed from the film 109 during this course.

In this step, the nickel element evaporates as nickel chloride and is thereby eliminated outside.

The thickness of the crystalline silicon film 109 decreases to 350 Å as a result of the formation of the thermal oxidation film.

Next, the thus-formed thermal oxidation film is removed. The crystalline silicon film 109 is patterned into a pattern of become the active layer (indicated by numeral 110 in FIG. 2B) of a TFT.

A gate insulating film 111 is then formed. Specifically, a 500-Å-thick silicon oxide film is formed by plasma CVD and then a 200-Å-thick thermal oxidation film is formed. The thermal oxidation film is formed inside the silicon oxide film that has been formed by CVD, i.e., on the surface of the active layer 110.

A 250-Å-thick active layer 110 and a 700-Å-thick gate insulating film 111 covering the active layer 110 are thus formed.

Thereafter, an aluminum film containing scandium at 0.18 wt % is formed by sputtering and then patterned into a starting member of a gate electrode.

The reason for having the aluminum film contain scandium is to prevent formation of protrusions called hillocks and whiskers in later steps.

An anodic oxide layer 113 (it is not appropriate to call this layer a film) and an anodic oxide film 114 are formed by performing anodization in the following manner with the gate electrode starting member used as the anode.

First, the porous anodic oxide layer 113 is formed by performing anodization in a state that a resist mask (not shown) that was used in patterning the aluminum film is left.

The anodic oxide film 114 that is dense in film quality is then formed by again performing anodization after removing the resist mask.

The growth lengths of the porous anodic oxide layer 113 and the dense anodic oxide film 114 are set at 400 nm and 80 nm, respectively.

An anodic oxide film can selectively be made porous or dense depending on the electrolyte used in the anodization.

Figure 2B:
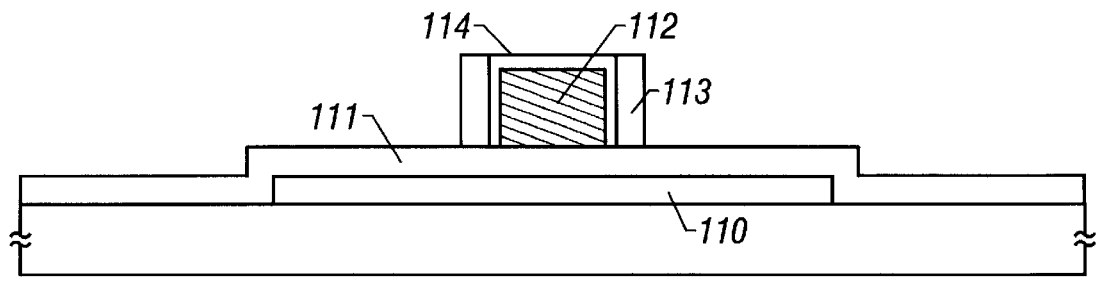
Figure 2C:
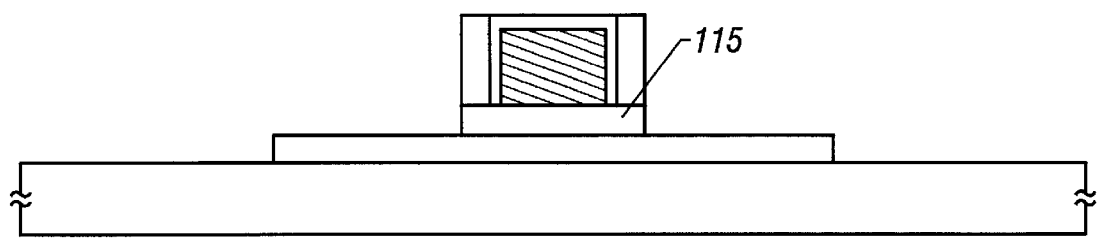
Figure 2D:
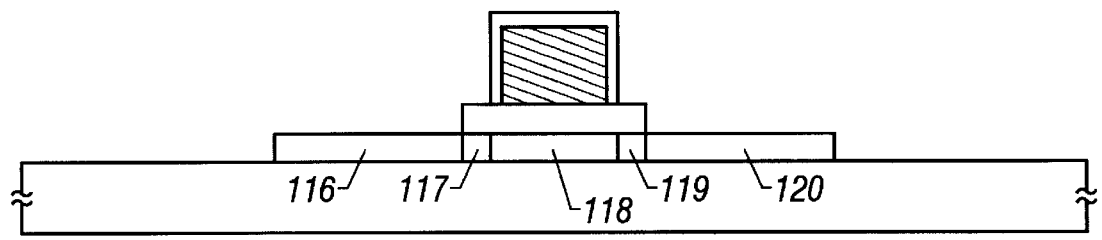
Figure 2E:
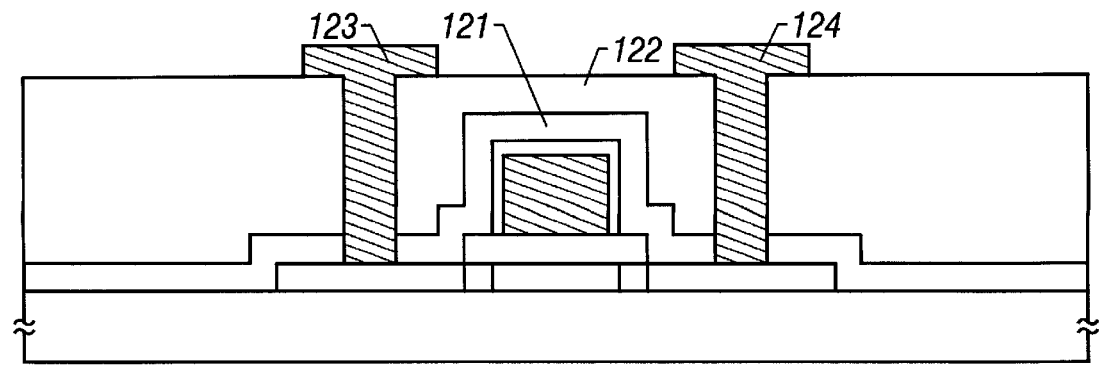

The state of FIG. 2B is thus obtained. Subsequently, the exposed part of the silicon oxide film 111 is removed to leave a gate insulating film 115 (see FIG. 2C).

Then, after the porous anodic oxide layer 113 is removed, the active layer 110 is doped with P (phosphorus) by plasma doping. As a result, a source region 116, a drain region 120, low-concentration impurity regions (high-resistivity regions) 117 and 119, and a channel forming region 118 are formed in a self-aligned manner (see FIG. 2D).

Subsequently, irradiation with laser light or infrared light is performed to activate the dopant introduced in the above step and to repair damage of the doped regions through annealing.

Then, a silicon nitride film 121 and a polyimide resin film 122 are formed as an interlayer insulating film. After contact holes are formed through the films 121 and 122, a source electrode 123 and a drain electrode 124 are formed. An n-channel thin-film transistor is thus completed (see FIG. 2E).

By employing the manufacturing process of this embodiment, a crystalline silicon film having superior crystallinity can be formed over a large area.

Embodiment 2

According to this embodiment, in the annealing step of the first embodiment that uses linear infrared light beams, auxiliary lamps are arranged in addition to the main lamps 107. The preliminary heating is performed on a region to be irradiated by the main lamps 107.

Figure 6A:
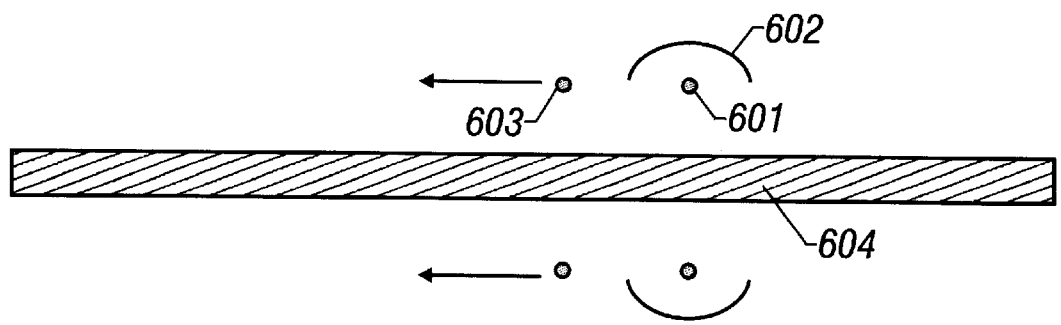
FIGS. 6A and 6B shows a step of obtaining a crystalline silicon film according to a second embodiment of the invention.
Figure 6B:
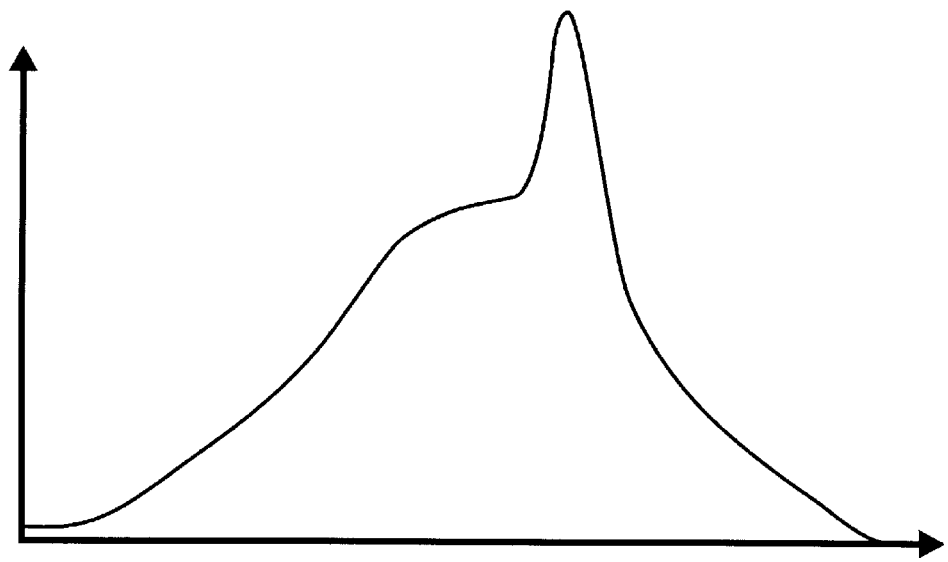

In this embodiment, auxiliary lamps 603 are disposed ahead of main lamps 601 as shown in FIG. 6A. Reflecting plates 602 are provided only for the main lamps 601, whereby a temperature gradient as shown in FIG. 6B is formed.

The crystal growth states can be changed by altering the shape of the temperature gradient.

Embodiment 3

According to this embodiment, in the constitution of the first embodiment, a silicon film is scanned with linear infrared light beams by moving the substrate rather than the lamp system.

The relative movement relationship between the substrate and the lamp system in this embodiment is the same as in the first embodiment.

Embodiment 4

According to this embodiment, in the constitution of the first embodiment, silicon or silicide is used to form the gate electrode of a TFT.

In this case, by virtue of high heat resistance of the gate electrode, the annealing to be performed after the impurity ion doping can be performed by a heat treatment.

Embodiment 5

According to this embodiment, in the constitution of the first embodiment, a TFT to be formed is of the bottom gate type structure. A bottom gate type TFT has been put into practical use in such a manner as to use an amorphous silicon film. Therefore, there is an advantage that a manufacturing process of this embodiment a manufacturing process of a bottom gate type TFT using an amorphous silicon film can be partially commonized.

Embodiment 6

According to this embodiment, a p-channel TFT and an n-channel TFT are formed on the same substrate by using the crystallization technique of this invention and a complementary circuit of those TFTs is formed.

In this embodiment, both of doping for imparting p-type conductivity and doping for imparting n-type conductivity need to be performed to separately provide the two types of channels.

Embodiment 7

According to this embodiment, in the constitution of the first embodiment, a semiconductor film of a silicon compound represented by $Si_xGe_{1-x}$ is used instead of a silicon film. The invention can also be applied to a compound semiconductor containing silicon.

Embodiment 8

According to this embodiment, in the constitution of the first embodiment, a polysilicon substrate is used as the substrate.

The polysilicon substrate that is used for the solar battery cannot be acquired at as low a price as the glass substrate.

In general, the polysilicon substrate is high in both impurity concentration and defect density and hence cannot be used as an IC substrate.

However, where the polysilicon substrate is used for forming a TFT, its high impurity concentration and defect density are not serious problems.

In this embodiment, a silicon oxide film is formed on the surface of a polysilicon substrate by plasma CVD and a thermal oxidation film is formed thereon to provide an insulating surface. A TFT is formed on the insulating surface by the method described in the first embodiment.

Embodiment 9

According to this embodiment, in the constitution of the first embodiment, nickel is introduced by ion implantation. In this case, the nickel introduction amount can be controlled precisely. Further, a resist material can be used to form the mask.

Embodiment 10

This embodiment is directed to examples of electronic apparatuses that use an integrated circuit constituted of TFTs. The lo invention can be applied to a circuit constituted of TFTs that are formed on a substrate having a proper insulating surface. FIGS. 5A–5F outline the respective apparatuses.

Figure 5A:
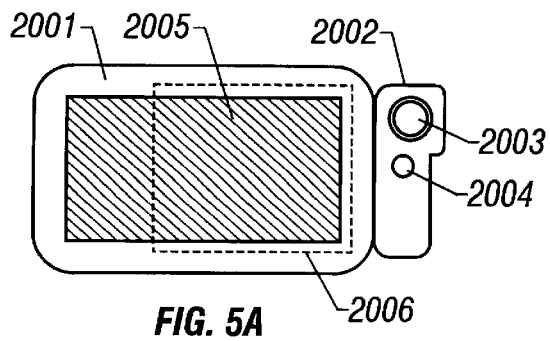
FIGS. 5A–5F schematically show various apparatuses according to a tenth embodiment of the invention.

FIG. 5A shows a portable information processing terminal having a function of performing communication via telephone lines.

In this electronic apparatus, an integrated circuit 2006 that is a composite circuit according to the invention is incorporated in a main body 2001. The electronic circuit further has an active matrix liquid crystal display 2005, a camera section 2002 for capturing an image, and a manipulation switch 2004.

Figure 5B:
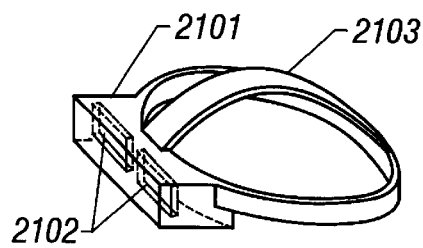

FIG. 5B shows an electronic apparatus called a head-mounted display, which has a function of virtually displaying, when mounted on a head, an image in front of the eyes. A main body 2101 is mounted on a head with a band 2103. An image is formed by liquid crystal display devices 2102 corresponding to the respective eyes.

Figure 5C:
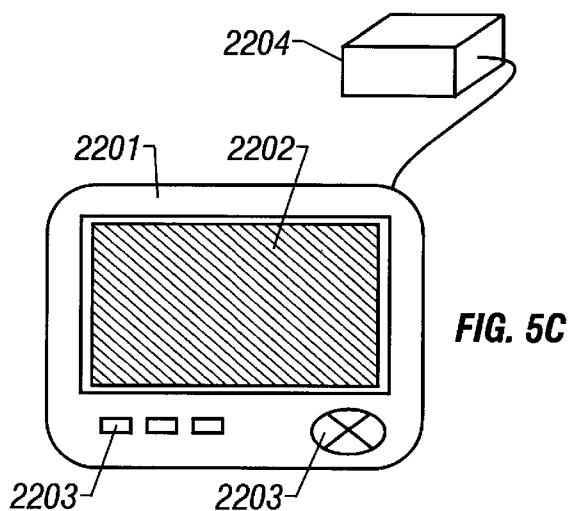

FIG. 5C shows a car navigation apparatus. This electronic apparatus has a function of displaying map information and other various kinds of information based on signals transmitted from an artificial satellite. Information transmitted from the satellite and received by an antenna 2204 is processed by electronic circuits incorporated in a main body 2201 and necessary information is displayed on a liquid crystal display device 2202. The apparatus is manipulated through manipulation switches 2203.

Figure 5D:
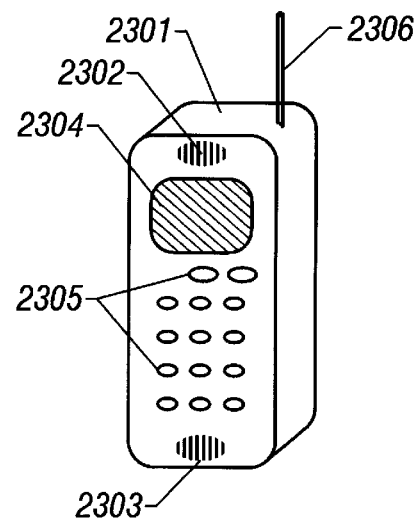

FIG. 5D shows a cellular telephone. In this electronic apparatus, a main body 2301 is provided with an antenna 2306, a voice output section 2302, a liquid crystal display device 2304, manipulation switches 2305, and a voice input section 2303.

Figure 5E:
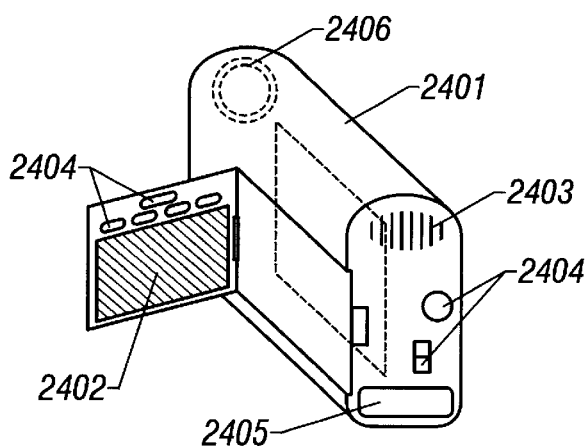

An electronic apparatus shown in FIG. 5E is a portable imaging apparatus called a video camera. In this electronic apparatus, a main body 2401 has, on an opening/closing member, a liquid crystal display 2402 and manipulation switches 2404.

The main body 2401 is further provided with an image receiving section 2406, integrated circuits 2407, a sound input section 2403, manipulation switches 2404, and a battery 2405.

Figure 5F:
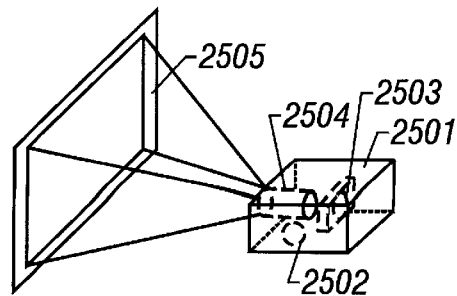

An electronic apparatus shown in FIG. 5F is a projection liquid crystal display device. In this apparatus, a main body 2501 is provided with a light source 2502, a liquid crystal display device 2503, and an optical system 2504. This apparatus has a function of projecting an image onto a screen 2505.

The liquid crystal display device used in each of the above electronic apparatuses may be of either a transmission type or a reflection type. The transmission type is advantageous in terms of display characteristics while the reflection type is advantageous for the purpose of lowering the power consumption or reducing the size and weight.

Flat panel displays such as an active matrix EL display and a plasma display can be used as the display device.

By utilizing the invention, a crystalline silicon film that can provide superior TFT characteristics can be obtained on a substrate having an insulating surface.

In particular, by equalizing crystal growth directions, grain boundaries extending directions can also be made coincident with those crystal growth directions. This is very effective in equalizing device characteristics of a number of devices because the states of grain boundaries in the active layer of each device can be made uniform among those devices.

Such a crystalline silicon film can be used to form thin-film semiconductor devices such sensors and a diode in addition to a TFT.

What is claimed is:

1. A method for manufacturing semiconductor material comprising the steps of:

introducing a metal element into a region of an amorphous semiconductor material, the metal element accelerating crystallization of the semiconductor film;

crystallizing at least part of the semiconductor material by scanning with at least one pair of upper and lower linear infrared lights in a predetermined direction, wherein said upper linear infrared light is located over said semiconductor material and said lower linear infrared light is located at an underside of said semiconductor material.

2. A method according to claim 1, wherein a temperature gradient is formed in said semiconductor material and extends in a direction from the region where the metal element is introduced to another region of the semiconductor material and coincides with the crystal growth direction.

3. A method according to claim 2, wherein the metal element diffuses in said predetermined direction by utilizing the temperature gradient and the crystal growth proceeds selectively in the predetermined direction.

4. The method according to claim 2, wherein the crystallizing step comprises of moving the temperature gradient in a direction of the crystal growth to be proceeded, in order to make the direction of the crystal growth in parallel with the semiconductor material.

5. The method according to claim 2, wherein the crystallizing step comprises moving the temperature gradient in a direction of the crystal growth at a speed corresponding to a rate of the crystal growth, to thereby make the direction of the crystal growth parallel with the semiconductor material.

6. The method according to claim 1, wherein said semiconductor material comprises silicon or silicon compound.

7. The method according to claim 1, wherein the metal element is nickel.

8. The method according to claim 1, wherein the metal element is one or a plurality of elements selected from the group consisting of Fe, Co, Ni, Cu, Ru, Rh, Pd, Os, Ir, Pt, and Au.

9. A method for manufacturing semiconductor device comprising the steps of:

forming an amorphous semiconductor film over a substrate;

introducing a metal element into a region of said amorphous semiconductor film, the metal element accelerating crystallization of the semiconductor film;

crystallizing at least part of the semiconductor film by scanning with at least one pair of upper and lower linear infrared lights in a predetermined direction, wherein said upper linear infrared light is located over said substrate and said lower linear infrared light is located at a backside of said substrate.

10. A method according to claim 9, wherein a temperature gradient are formed in said semiconductor film and extends in a direction from the region where the metal element is introduced to another region of the semiconductor film and coincides with the crystal growth direction.

11. A method according to claim 10, wherein the metal element diffuses in a predetermined direction by utilizing the temperature gradient and the crystal growth proceeds selectively in the predetermined direction.

12. The method according to claim 10, wherein the crystallizing step comprises of moving the temperature gradient in a direction of the crystal growth to be proceeded, in order to make the direction of the crystal growth in parallel with the semiconductor film.

13. The method according to claim 10, wherein the crystallizing step comprises moving the temperature gradient in a direction of the crystal growth at a speed corresponding to a rate of the crystal growth, to thereby make the direction of the crystal growth parallel with the amorphous film.

14. The method according to claim 9, wherein semiconductor film comprises silicon or silicon compound.

15. The method according to claim 9, wherein the metal element is nickel.

16. The method according to claim 9, wherein the metal element is one or a plurality of elements selected from the group consisting of Fe, Co, Ni, Cu, Ru, Rh, Pd, Os, Ir, Pt, and Au.

17. A method for manufacturing semiconductor material comprising a step of:

crystallizing at least one portion of an amorphous semiconductor material by scanning the semiconductor material with at least one pair of linear infrared lights in a predetermined direction at a speed corresponding to a rate of crystal growth, wherein one of said linear infrared lights is located over said semiconductor material and the other one of said linear infrared lights is located at an underside of said semiconductor material.

18. The method according to claim 17, wherein the predetermined direction coincide with the direction of the crystal growth.

19. The method according to claim 17, wherein the crystal growth expends in the direction parallel with the semiconductor material.

20. The method according to claim 17, wherein the semiconductor material comprises silicon or silicon compound.

21. The method according to claim 17, wherein said semiconductor material includes at least one metal element selected from the group consisting of Fe, Co, Ni, Cu, Ru, Rh, Pd, Os, Ir, Pt, and Au.

22. A method for manufacturing semiconductor device comprising the steps of:

forming an amorphous semiconductor film over a substrate; and crystallizing at least one portion of the semiconductor film by scanning the semiconductor film with at least one pair of linear infrared lights in a predetermined direction at a speed corresponding to a rate of crystal growth, wherein one of said linear infrared lights is located over said substrate and the other one of said linear infrared lights is located at a backside of said substrate.

23. The method according to claim 22, wherein said semiconductor film includes at least one +metal element selected from the group consisting of Fe, Co, Ni, Cu, Ru, Rh, Pd, Os, Ir, Pt, and Au.

24. The method according to claim 22, wherein the semiconductor film comprises silicon or silicon compound.

25. A method for manufacturing semiconductor material comprising the steps of:

introducing a metal element into at least one region of an amorphous semiconductor material, the metal element accelerating crystallization of the semiconductor material; and crystallizing at least one portion of the semiconductor material by scanning the semiconductor material with at least one pair of upper and lower linear infrared lights in a direction from the region introduced the metal element to another part of the semiconductor material in order to form and move a temperature gradient in the semiconductor material, wherein said upper linear infrared light is located over said semiconductor material and said lower linear infrared light is located at an underside of said semiconductor material.

26. The method according to claim 25, wherein the scanning direction coincide with the direction of crystal growth in the semiconductor material.

27. The method according to claim 25, wherein crystal growth in the semiconductor material expends in the direction parallel with the semiconductor material.

28. The method according to claim 25, wherein the semiconductor material comprises silicon or silicon compound.

29. The method according to claim 25, wherein the metal element is one or a plurality of elements selected from the group consisting of Fe, Co, Ni, Cu, Ru, Rh, Pd, Os, Ir, Pt, and Au.

30. A method for manufacturing semiconductor device comprising the steps of:

introducing a metal element into at least one region of an amorphous semiconductor film, the metal element accelerating crystallization of the semiconductor film; and crystallizing at least one portion of the semiconductor film by scanning the semiconductor film with at least one pair of upper and lower linear infrared lights in a direction from the region introduced the metal element to another part of the semiconductor film in order to form and move a temperature gradient in the semiconductor film, wherein said upper linear infrared light is located over said semiconductor film and said lower linear infrared light is located at an underside of said semiconductor film.

31. The method according to claim 30, wherein the scanning direction coincide with the direction of crystal growth in the semiconductor film.

32. The method according to claim 30, wherein crystal growth in the semiconductor film expends in the direction parallel with the semiconductor film.

33. The method according to claim 30, wherein the semiconductor film comprises silicon or silicon compound.

34. The method according to claim 30, wherein the metal element is one or a plurality of elements selected from the group consisting of Fe, Co, Ni, Cu, Ru, Rh, Pd, Os, Ir, Pt, and Au.

35. The method according to claim 9, wherein said device is an EL display device.

36. The method according to claim 22, wherein said device is an EL display device.

37. The method according to claim 30, wherein said device is an EL display device.

38. A method for manufacturing a semiconductor device comprising the steps of:

forming a semiconductor film over a substrate;

introducing at least one impurity element into said semiconductor film; and irradiating said semiconductor film by scanning with at least one pair of linear infrared lights in a predetermined direction, wherein one of said linear infrared lights is located over said substrate and the other one of said linear infrared lights is located at a backside of said substrate.

39. A method according to claim 38 wherein said semiconductor film comprises silicon or silicon compound represented by $Si_xGe_{1-x}$.

40. A method according to claim 38 further comprising a step of forming gate electrode over said semiconductor film with a gate insulating film interposed therebetween.

41. A method according to claim 38 further comprising a step of forming gate electrode over said substrate before forming said semiconductor film.

42. A method according to claim 38 wherein said semiconductor device having an EL display device.

43. A method for manufacturing a semiconductor device comprising the steps of:

forming a semiconductor film over a substrate;

introducing at least one impurity element into selected portions of said semiconductor film; and activating said impunity element introduced in said portion by scanning said semiconductor film with at least one pair of linear infrared lights in a predetermined direction, wherein one of said linear infrared lights is located over said substrate and the other one of said linear infrared lights is located at a backside of said substrate.

44. A method according to claim 43 wherein said semiconductor film comprises silicon or silicon compound represented by $Si_xGe_{1-x}$.

45. A method according to claim 43 further comprising a step of forming gate electrode over said semiconductor film with a gate insulating film interposed therebetween.

46. A method according to claim 43 further comprising a step of forming gate electrode over said substrate before forming said semiconductor film.

47. A method according to claim 43 wherein said semiconductor device having an EL display device.

48. A method for manufacturing a semiconductor device comprising the steps of:

forming a semiconductor film over a substrate, said semiconductor film having at least a channel forming region and source and drain regions;

irradiating said semiconductor film by scanning with at least one pair of linear infrared lights in a predetermined direction in order to activate said source and drain regions, wherein one of said linear infrared lights is located over said substrate and the other one of said linear infrared lights is located at a backside of said substrate.

49. A method according to claim 48 wherein said semiconductor film comprises silicon or silicon compound represented by $Si_xGe_{1-x}$.

50. A method according to claim 48 further comprising a step of forming gate electrode over said semiconductor film with a gate insulating film interposed therebetween.

51. A method according to claim 48 further comprising a step of forming gate electrode over said substrate before forming said semiconductor film.

52. A method according to claim 48 wherein said semiconductor device having an EL display device.

53. A method for manufacturing a semiconductor device comprising the steps of:

forming a semiconductor film over a substrate; and irradiating said semiconductor film with at least one pair of linear infrared lights while moving said substrate in a direction perpendicular to the linear infrared lights, wherein one of said linear infrared lights is located over said substrate and the other one of said linear infrared lights is located at a backside of said substrate.

54. A method according to claim 53 wherein said semiconductor film comprises silicon or silicon compound represented by $Si_xGe_{1-x}$.

55. A method according to claim 53 further comprising a step of forming gate electrode over said semiconductor film with a gate insulating film interposed therebetween.

56. A method according to claim 53 further comprising a step of forming gate electrode over said substrate before forming said semiconductor film.

57. A method according to claim 53 wherein said semiconductor device having an EL display device.

58. A method for manufacturing a semiconductor device comprising the steps of:

forming a semiconductor film over a substrate; and crystallizing said semiconductor film by irradiating said semiconductor film with at least one pair of linear infrared lights while moving said substrate in a perpendicular to the linear infrared lights, wherein one of said linear infrared lights is located over said substrate and the other one of said linear infrared lights is located at a backside of said substrate.

59. A method according to claim 58 wherein said semiconductor film comprises silicon or silicon compound represented by $Si_xGe_{1-x}$.

60. A method according to claim 58 further comprising a step of forming gate electrode over said semiconductor film with a gate insulating film interposed therebetween.

61. A method according to claim 58 further comprising a step of forming gate electrode over said substrate before forming said semiconductor film.

62. A method according to claim 58 wherein said semiconductor device having an EL display device.

63. A method for manufacturing a semiconductor device comprising the steps of:

forming a semiconductor film over a substrate, said semiconductor film having at least a channel forming region and source and drain regions; and irradiating said semiconductor film with at least one pair of linear infrared lights while moving said substrate in a direction perpendicular to the linear infrared lights in order to activate said source and drain regions, wherein one of said linear infrared lights is located over said substrate and the other one of said linear infrared lights is located at a backside of said substrate.

64. A method according to claim 63 wherein said semiconductor film comprises silicon or silicon compound represented by $Si_xGe_{1-x}$.

65. A method according to claim 63 further comprising a step of forming gate electrode over said semiconductor film with a gate insulating film interposed therebetween.

66. A method according to claim 63 further comprising a step of forming gate electrode over said substrate before forming said semiconductor film.

67. A method according to claim 63 wherein said semiconductor device having an EL display device.

68. A method for manufacturing a semiconductor device comprising the steps of:

forming a semiconductor film over a substrate; and irradiating said semiconductor film with a plurality pairs of linear infrared lights by scanning said light in a direction perpendicular to a longitudinal direction of the linear infrared lights, each of said pairs of pairs of linear infrared lights consisting of an upper linear infrared light and a lower linear infrared light, wherein each upper linear infrared light is located over said substrate and each lower linear infrared light is located at a backside of said substrate.

69. A method according to claim 68 wherein said semiconductor film comprises silicon or silicon compound represented by $Si_xGe_{1-x}$.

70. A method according to claim 68 further comprising a step of forming gate electrode over said semiconductor film with a gate insulating film interposed therebetween.

71. A method according to claim 68 further comprising a step of forming gate electrode over said substrate before forming said semiconductor film.

72. A method according to claim 68 wherein said semiconductor device having an EL display device.

73. A method for manufacturing a semiconductor device comprising the steps of:

forming a semiconductor film over a substrate; and crystallizing said semiconductor film by scanning with a plurality of pairs of linear infrared lights in a direction perpendicular to a longitudinal direction of the linear infrared lights, each of said pairs of pairs of linear infrared lights consisting of an upper linear infrared light and a lower linear infrared light, wherein each upper linear infrared light is located over said substrate and each lower linear infrared light is located at a backside of said substrate.

74. A method according to claim 73 wherein said semiconductor film comprises silicon or silicon compound represented by $Si_xGe_{1-x}$.

75. A method according to claim 73 further comprising a step of forming gate electrode over said semiconductor film with a gate insulating film interposed therebetween.

76. A method according to claim 73 further comprising a step of forming gate electrode over said substrate before forming said semiconductor film.

77. A method according to claim 73 wherein said semiconductor device having an EL display device.

78. A method for manufacturing a semiconductor device comprising the steps of:

forming a semiconductor film over a substrate;

introducing at least one impurity element into said semiconductor film; and then irradiating said semiconductor film with a plurality pairs of linear infrared lights by scanning said light in a direction perpendicular to a longitudinal direction of the linear infrared lights, each of said pairs of pairs of linear infrared lights consisting of an upper linear infrared light and a lower linear infrared light, wherein each upper linear infrared light is located over said substrate and each lower linear infrared light is located at a backside of said substrate.

79. A method according to claim 78 wherein said semiconductor film comprises silicon or silicon compound represented by $Si_xGe_{1-x}$.

80. A method according to claim 78 further comprising a step of forming gate electrode over said semiconductor film with a gate insulating film interposed therebetween.

81. A method according to claim 78 further comprising a step of forming gate electrode over said substrate before forming said semiconductor film.

82. A method according to claim 78 wherein said semiconductor device having an EL display device.

* * * * *